(12) United States Patent
Schimpf

(10) Patent No.: US 10,742,007 B2
(45) Date of Patent: Aug. 11, 2020

(54) PHOTOVOLTAIC WIRE MANAGEMENT SYSTEM

(71) Applicant: Brady Schimpf, Provo, UT (US)

(72) Inventor: Brady Schimpf, Provo, UT (US)

(73) Assignee: SCH LLC, Provo, UT (US)

( * ) Notice: Subject to any disclaimer, the term of this patent is extended or adjusted under 35 U.S.C. 154(b) by 0 days.

(21) Appl. No.: 16/030,343

(22) Filed: Jul. 9, 2018

(65) Prior Publication Data
US 2019/0013653 A1  Jan. 10, 2019

Related U.S. Application Data

(60) Provisional application No. 62/530,053, filed on Jul. 7, 2017.

(51) Int. Cl.
*H02G 3/04* (2006.01)
*H02S 30/10* (2014.01)
*H02S 40/30* (2014.01)
*H02S 40/36* (2014.01)
*H01L 31/042* (2014.01)

(52) U.S. Cl.
CPC .......... *H02G 3/045* (2013.01); *H01L 31/042* (2013.01); *H02G 3/0406* (2013.01); *H02S 30/10* (2014.12); *H02S 40/30* (2014.12); *H02S 40/36* (2014.12)

(58) Field of Classification Search
CPC ........ H02G 3/045; H02G 3/0406; H02G 3/00; H02G 3/02; H02G 3/0437; H02G 3/04; H02S 30/10; H02S 40/30; H02S 40/36; H02S 30/00; H01L 31/042

USPC ........... 174/480, 481, 503, 68.1, 68.3, 72 A, 174/88 R, 70 C, 95; 248/49, 68.1, 73, 248/74.1; 385/134, 135
See application file for complete search history.

(56) References Cited

U.S. PATENT DOCUMENTS

| 2,023,433 | A | * | 12/1935 | McConnell | ............ H02G 3/045 174/50 |
| 6,380,484 | B1 | * | 4/2002 | Theis | ............ H02G 3/045 174/68.3 |
| 6,460,812 | B1 | * | 10/2002 | Jette | ............ H02G 3/0443 248/68.1 |
| 6,972,367 | B2 | * | 12/2005 | Federspiel | ............ H02G 3/0418 174/481 |
| 7,049,508 | B2 | * | 5/2006 | Bushey | ............ H02G 3/0425 174/481 |
| 7,607,618 | B2 | * | 10/2009 | Mori | ............ H02G 3/32 248/68.1 |
| 8,985,530 | B2 | * | 3/2015 | Jette | ............ H02G 3/0443 248/49 |

(Continued)

*Primary Examiner* — Angel R Estrada
(74) *Attorney, Agent, or Firm* — Law Offices of Damon L. Boyd, PLLC

(57) ABSTRACT

A wire management duct having is provided with a wire channel along the length of the duct. In an embodiment, the duct is further comprising a mounting lip to mount the duct onto a mounting rail of photovoltaic array mounting rail system. In another embodiment, a wire management system is comprised of one or more wire management ducts which may be mounted parallel to the mounting rails of photovoltaic array mounting rail system or perpendicular to the rails using an attachment clip. In a further embodiment, mounting clips are provided to attach the wire management ducts directly to the frame of a photovoltaic module.

15 Claims, 13 Drawing Sheets

(56) References Cited

U.S. PATENT DOCUMENTS 9,671,046 B2 * 6/2017 Whipple .................. H02G 3/30
9,800,028 B1 * 10/2017 Smith ...................... H02G 3/30

* cited by examiner

PHOTOVOLTAIC WIRE MANAGEMENT SYSTEM

CROSS-REFERENCE TO RELATED APPLICATION(S)

The present application claims priority to U.S. Provisional Patent Application No. 62/530,053 filed on Jul. 7, 2017, entitled "Module-Attached PV Wire Management Tray" the entire disclosure of which is incorporated by reference herein.

BACKGROUND OF THE INVENTION

Photovoltaic (PV) solar arrays are typically comprised of optimizers and microinverters, commonly called Module Level Power Electronics (MLPEs) and PV Modules which are secured with structures called racking. Racking systems may include rails which support the modules or attach directly to module frames without rails. Most rooftop racking systems are designed to mount arrays with a low profile and minimal clearance from the surface to which they are attached.

Most PV components interface with standardized components, such that different brands of modules, MLPEs, racking, and wire management devices can be combined into a complete PV system. Typically, cables are terminated with industry standard connectors and are factory-connected inside the modules and MLPEs. The cables are connected and run under the modules, both parallel and perpendicular to mounting rails. In some scenarios, cables with custom lengths and matching connectors are made on-site. Both factory connected cables and cables created on site are secured so that they do not hang loose, sag, or come into contact with damaging or abrasive surfaces. The act of securing these cables is commonly referred to as "wire management."

One common industry practice is to use zip ties or wire clips to secure wires to module frames or rails. This practice is time-consuming, lacks longevity and can easily damage the conductors. Plastic zip ties, even UV resistant versions, degrade and break with the intense UV and heat exposure common in PV solar arrays. Metal zip ties are an alternative but have sharp edges that can cut into and damage cables. Furthermore, this practice is time-consuming and requires installers to pick up, properly orient and attach small components.

All of these means of wire attachment/securing require technicians to install conductors under tension to ensure the portions spanning between attachments stay above the roof surface and do not sag. To maintain this tension, installers often pull the wires around racking components, which can abrade and cut into the wire. However, the wires are subject to thermal expansion which can significantly change the length of the wires. For example, if the wires are installed under tension on a warm day, they can shrink and pull out of the wire clip attachments in cold weather. In extreme situations, conductors can even pull out of the electrical connectors resulting in arcing, and electrical hazards.

There are various other PV wire management devices such as "Hanging Wire Ways", "Racking Integrated" or "Rail Integrated" wire management devices. Each of these devices are difficult to install, are cost prohibitive, or require custom modules or racking. Some rails and modules have integrated wire management features, but they are not compatible to manage wires sets running perpendicular to the mounting rail. Furthermore, they lack industry standard interfacing features, which locks consumers into a specific brand.

Cable Ways are a common product used in the electrical industry. These trays are large-scale and designed for used in large commercial and industrial applications. They typically mount to structures, struts, or hangers. MP Husky, Legrand, Cooper Industries are all companies that produce cable trays. However, these trays cannot attach directly to rails and module frames, cannot clamp and secure a cable exiting the device, and do not fit in the space under standard rooftop racking systems. Therefore, they are not ideal for managing cables running under modules to connect components within the array. There are Cable Ways designed specifically for use on PV solar arrays, but they interfere with racking/mounting components when used within the array.

What is needed is a wire management system in which cables can be laid and secured without tension or contact with sharp edges, a universal system compatible with all PV modules, and a system which mounts to the module frame or mounting rails without interfering with common racking/mounting systems and MLPEs. What is further desired is a wire management system which is durable protects the wires placed within the system.

SUMMARY OF THE INVENTION

In an embodiment, a wire management duct is provided. The wire management duct has a length and a wire channel provided along the length. The wire channel is configured to hold a plurality of wires or cables.

In an embodiment, the wire channel is further provided with a channel wall and an opening catch. An opening is provided between the channel wall and opening catch to allow the plurality of wires or cables to be placed into the wire channel.

In an embodiment, one or more mounting lips are provided along the length of the duct. In the embodiment, the mounting lips are formed by a curved section terminating at a hook. The mounting lips are provided to mount the wire management duct onto a mounting rail of a photovoltaic rail mounting system.

The foregoing, and other features and advantages of the invention, will be apparent from the following, more particular description of the embodiments of the invention, the accompanying drawings, and the claims.

BRIEF DESCRIPTION OF THE DRAWINGS

For a more complete understanding of the present invention, the objects and advantages thereof, reference is now made to the ensuing descriptions taken in connection with the accompanying drawings briefly described as follows.

DETAILED DESCRIPTION OF EMBODIMENTS

Figure 1:
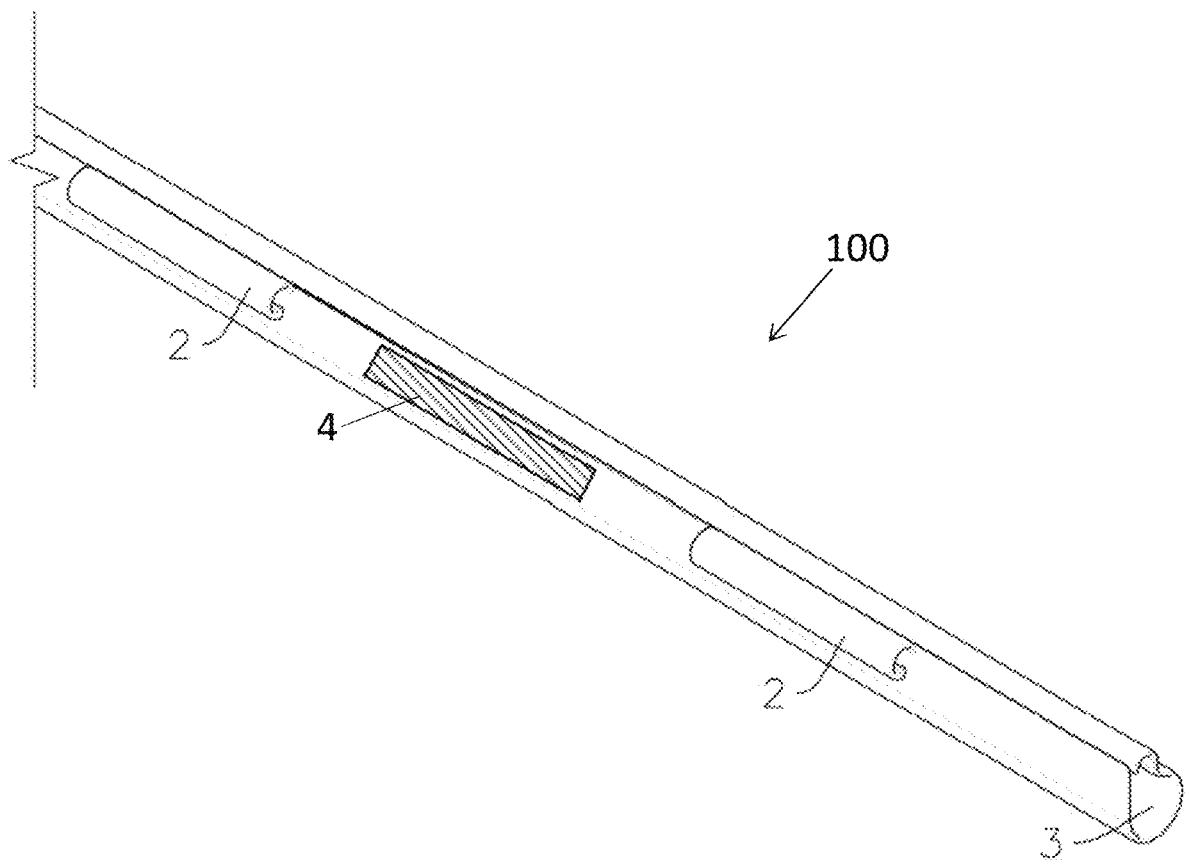
FIG. 1 is a perspective view of the photovoltaic wire management system, according to an embodiment of the present invention.

Embodiments of the present invention and their advantages may be understood by referring to FIGS. 1-13, wherein like reference numerals refer to like elements.

Figure 2:
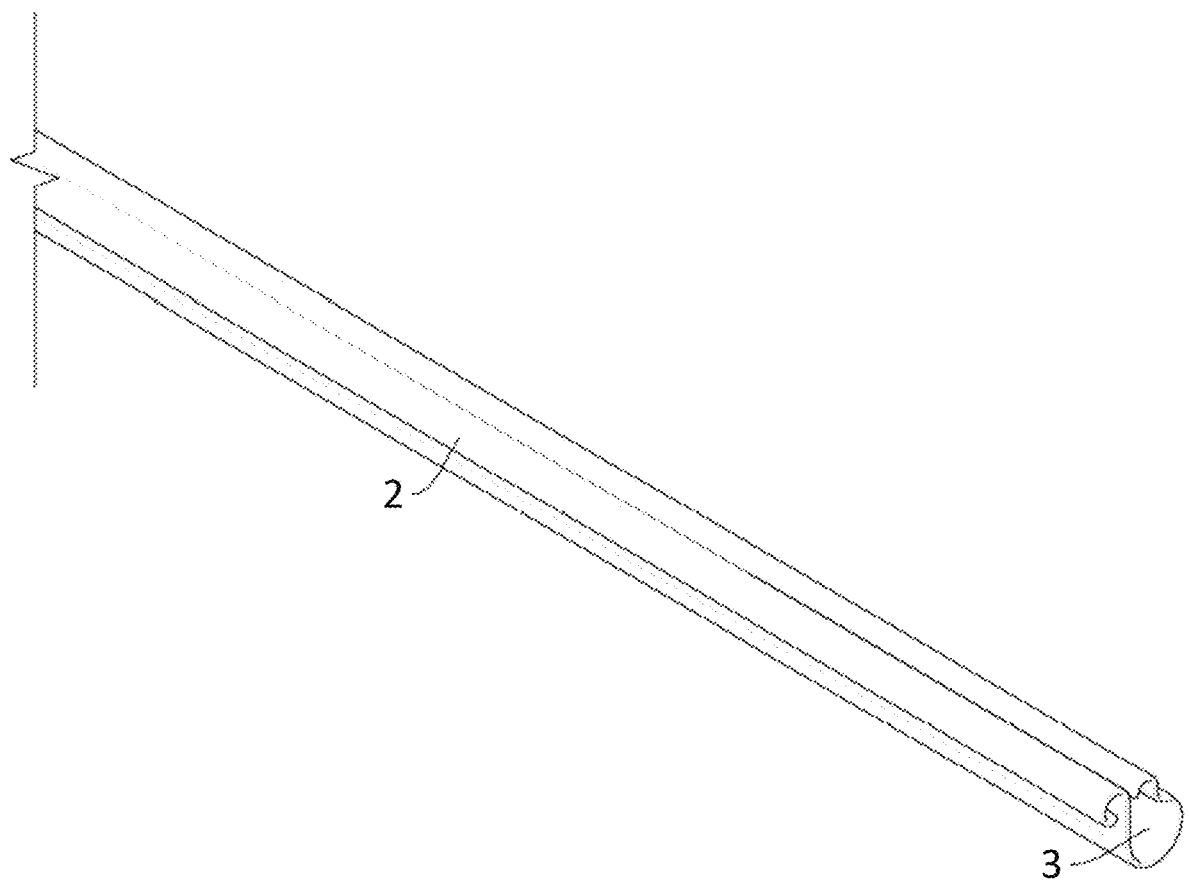
FIG. 2 is a perspective view of the photovoltaic wire management system, according to an embodiment of the present invention.

In reference to FIGS. 1-2, an embodiment of the wire management system is shown wherein a wire management duct 100 is comprised of a mounting lip 2 and a wire channel 3. The duct can vary in length but is typically installed to run the entire length of the Photovoltaic (PV) module frames or mounting rails.

Figure 4:
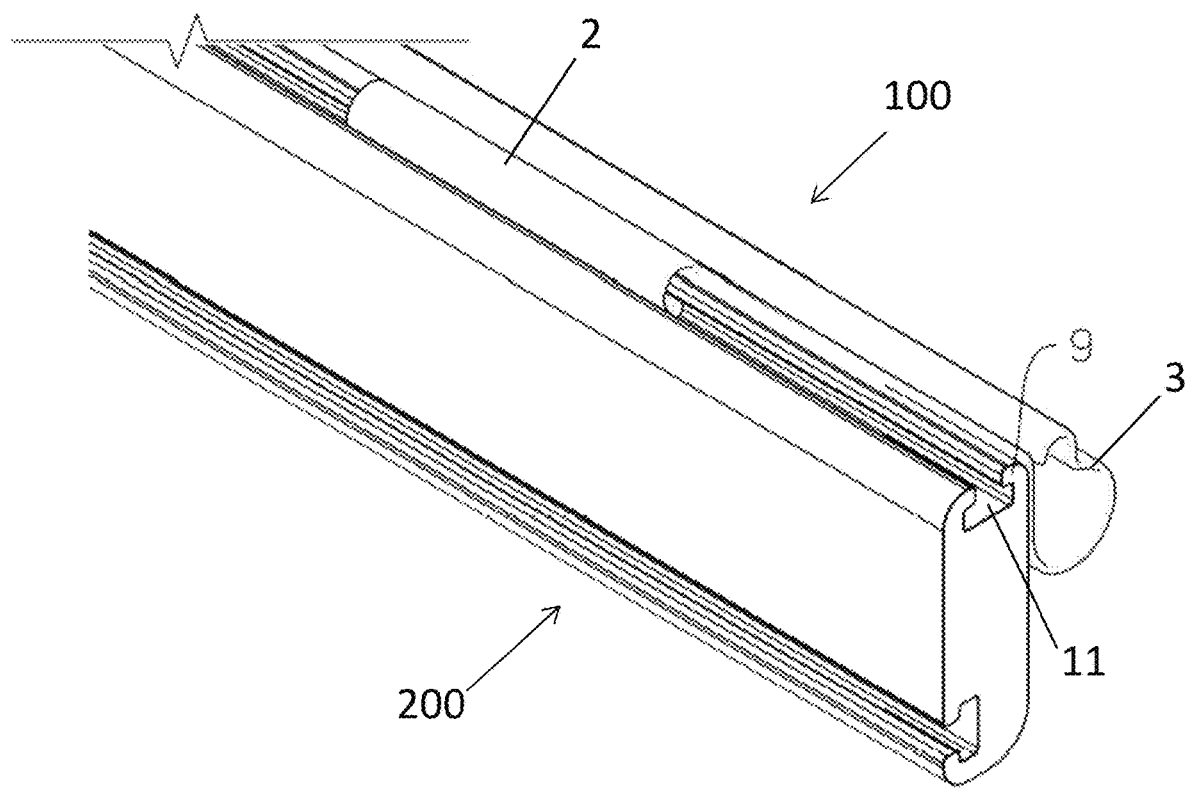
FIG. 4 is a perspective view of the photovoltaic wire management system, according to an embodiment of the present invention.

In an embodiment, the mounting lip 2, is provided to attach the duct to a rail mounting slot of a PV mounting rail (as shown in FIG. 4). In the embodiment shown in FIG. 1, multiple mounting lips 2 are provided along sections of the duct. In the embodiment shown in FIG. 2, a continuous mounting lip 2 is provided along the length of the duct.

Figure 3:
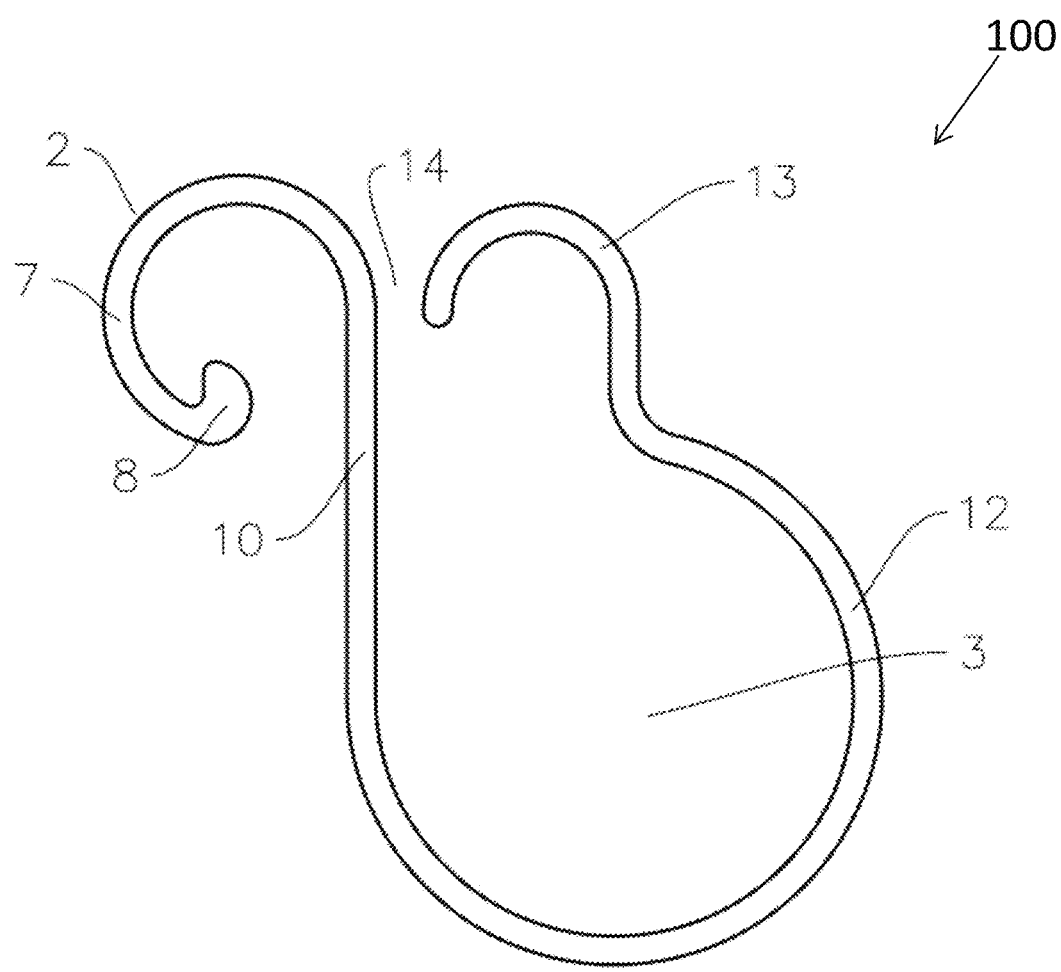
FIG. 3 is a side view of the photovoltaic wire management system, according to an embodiment of the present invention.

With reference to FIG. 3, an embodiment of the wire management system is shown wherein a wire management duct 100 is comprised of a mounting lip 2 and a wire channel 3. In an embodiment, the mounting lip 2 is comprised of a curved section 7 which terminates at a hook 8. In an embodiment, the curved section is provided as an arc maintaining a constant radius. The hook 8 is configured to engage with a ledge of a rail mounting slot (9 as shown in FIG. 4).

With further reference to FIG. 3, according to an embodiment, the wire channel 3 comprises a channel wall 10. In an embodiment, the channel wall 10 is provided as a straight portion which may rest against the rail when in a parallel with the rail. In an embodiment, the channel wall 10 may be provided with an adhesive backing for mounting (shown as 4 in FIG. 1).

In an embodiment, the wire channel 3 is further comprised of bottom portion 12 formed by a large curve radius, and an opening catch 13 formed by a smaller curve radius. An opening 14 is provided to accept wires or cables into the wire channel 3. In an embodiment, the curved segments of opening catch 13 and the curved section 7 of the mounting lip 2 allow for wires to easily pass through the opening 14. Furthermore, the opening catch 13 of the wire channel 3 is curved to prevent wires or cables from accidentally falling out of the wire channel.

In an exemplary embodiment, with reference to FIG. 3, the wire management duct 100 the outer dimensions of the cross-sectional portion where a mounting lip 2 is approximately 33 millimeters (mm) high by 33 mm wide. In an embodiment, the curved section 7 of the mounting lip 2 has a constant radius of curvature of approximately 4.5 mm. The hook 8 is provided with a radius of about 1.8 mm and protrudes 2 mm from the terminal end of the curved section 7. The end of the hook is spaced about 4 mm from the channel wall 10. In an embodiment, bottom portion 12 of the wire channel 3 has a constant radius of about 10 mm. The opening catch is provided with a constant radius of about 3.3 mm. In the exemplary embodiment, the space provided between the curved segments of opening catch 13 and the curved section 7 to provide is about 2 mm to form the opening 2. In an embodiment, the thickness of material which forms the duct is about 1.2 mm.

In reference to FIG. 4, an embodiment of the wire management system is shown, wherein a wire management duct 100 is mounted to a mounting rail 200. In the embodiment, the mounting lip(s) 2 of the wire management duct are engaged with a ledge 9 of the rail slot 11 such that the hook of the mounting lip(s) (shown as 8 in FIG. 3) catches on the ledge 9. In the embodiment, the hook 8 has a shape and size to act as a wedge and smoothly engage the ledge 9. The elasticity of the curved section 7 of the mounting lip 2 provides tension to push the hook 8 inwards, decreasing the distance between the hook and channel body, as the nub slides down past the ledge 9 and into the rail mounting slot 11 to lock the duct into place.

Figure 5:
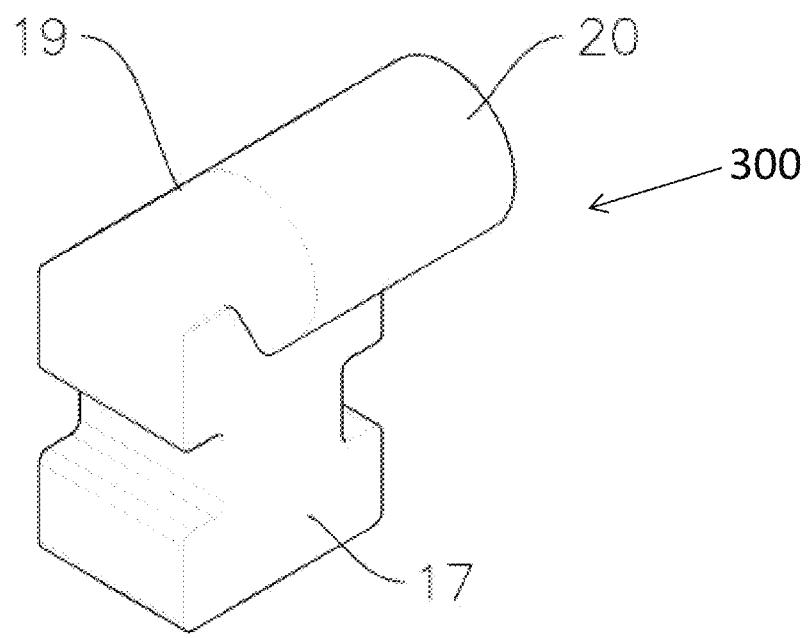
FIG. 5 is a perspective view of an attachment component of the photovoltaic wire management system, according to an embodiment of the present invention.
Figure 6:
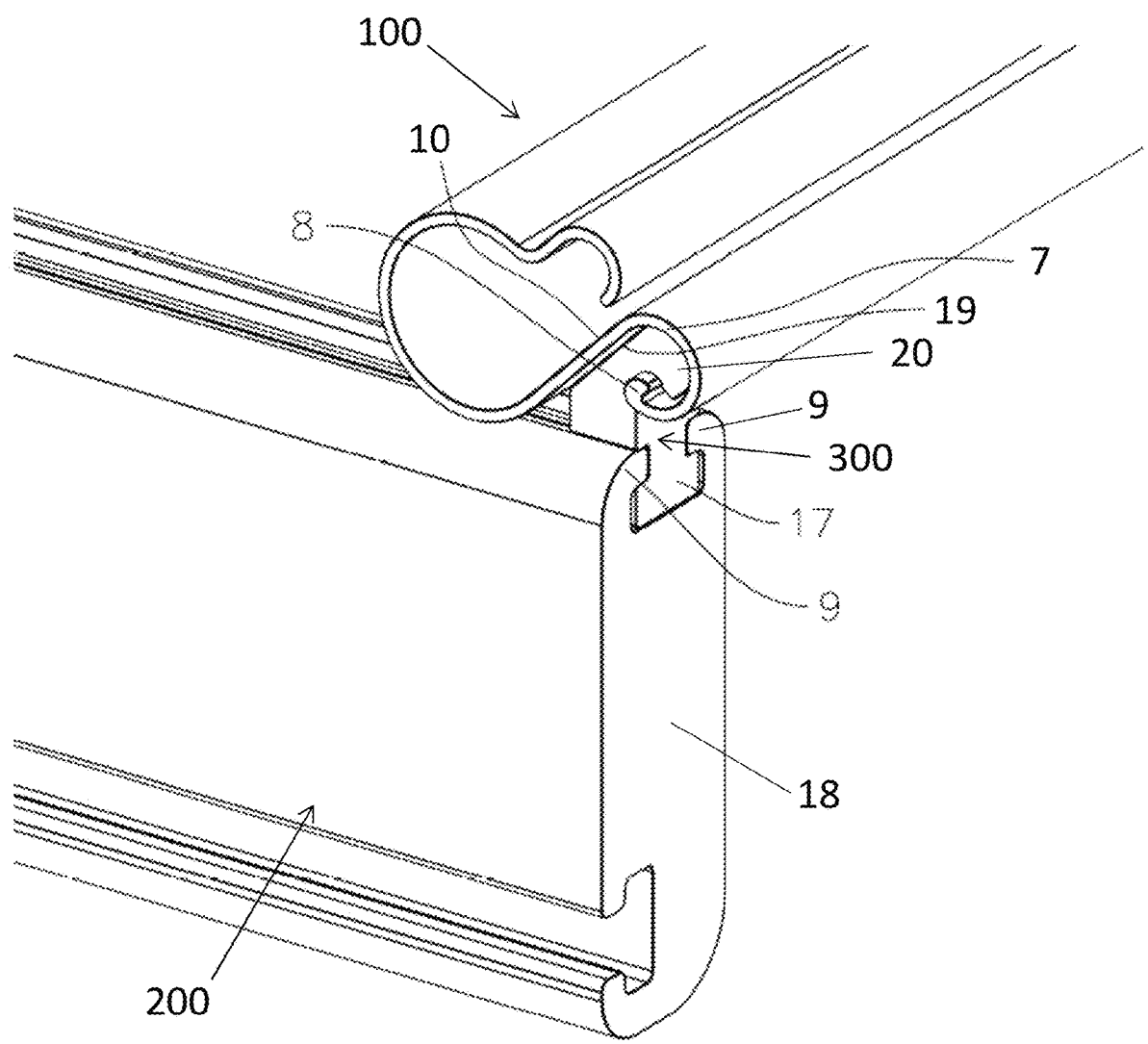
FIG. 6 is a perspective view of an attachment component the photovoltaic wire management system in use, according to an embodiment of the present invention.

In reference to FIGS. 5-6, an embodiment of a perpendicular attachment clip 300 component is shown. The clip 300 is provided with a rail slot adapter 17 and a duct adapter 20. In the embodiment, the rail slot adapter 17 is provided to be inserted into a rail slot of a rail mounting system 200. The duct adapter 20 is provided to engage the mounting lip 2 of the wire management duct 100. In an embodiment, the clip 300 is further provided with an angled support shelf 19, to support the channel wall 10 of the wire management duct 100.

With reference to FIG. 6, an embodiment of the perpendicular attachment clip 300 is shown, wherein the rail slot adapter 17 of the clip has been slid into an end 18 of a rail mount 200. The clip may be placed anywhere along the length of the rail slot and will be held in place by the ledges 9.

Figure 7:
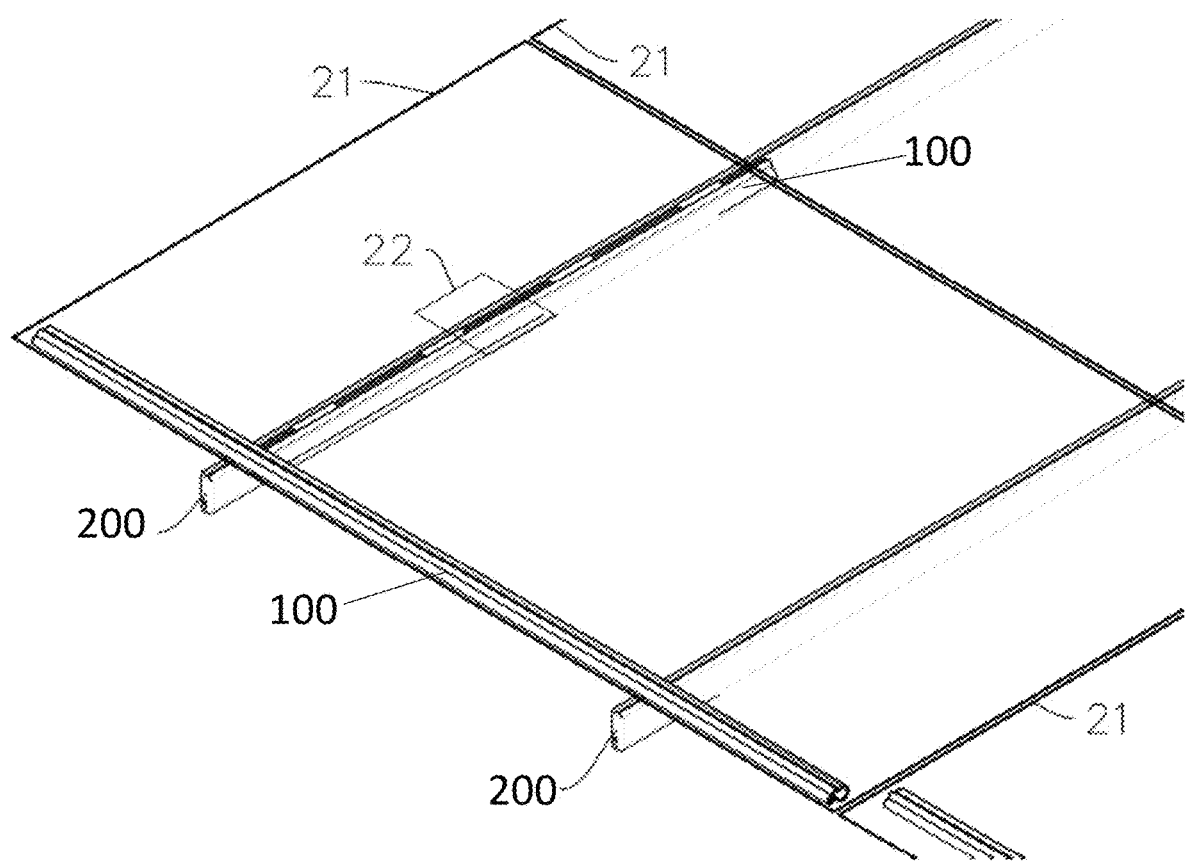
FIG. 7 is a perspective view of the photovoltaic wire management system in use, according to an embodiment of the present invention.

With reference to FIG. 7, an embodiment of the photovoltaic wire management system is shown in use. In the embodiment, a typical photovoltaic array is shown comprised of modules 21, Module Level Power Electronics 22, and mounting rails 200. In the embodiment, wire management ducts 100 are provided to house the cables and wires of the array and are oriented both perpendicular and parallel to the mounting rails 200.

Figure 8:
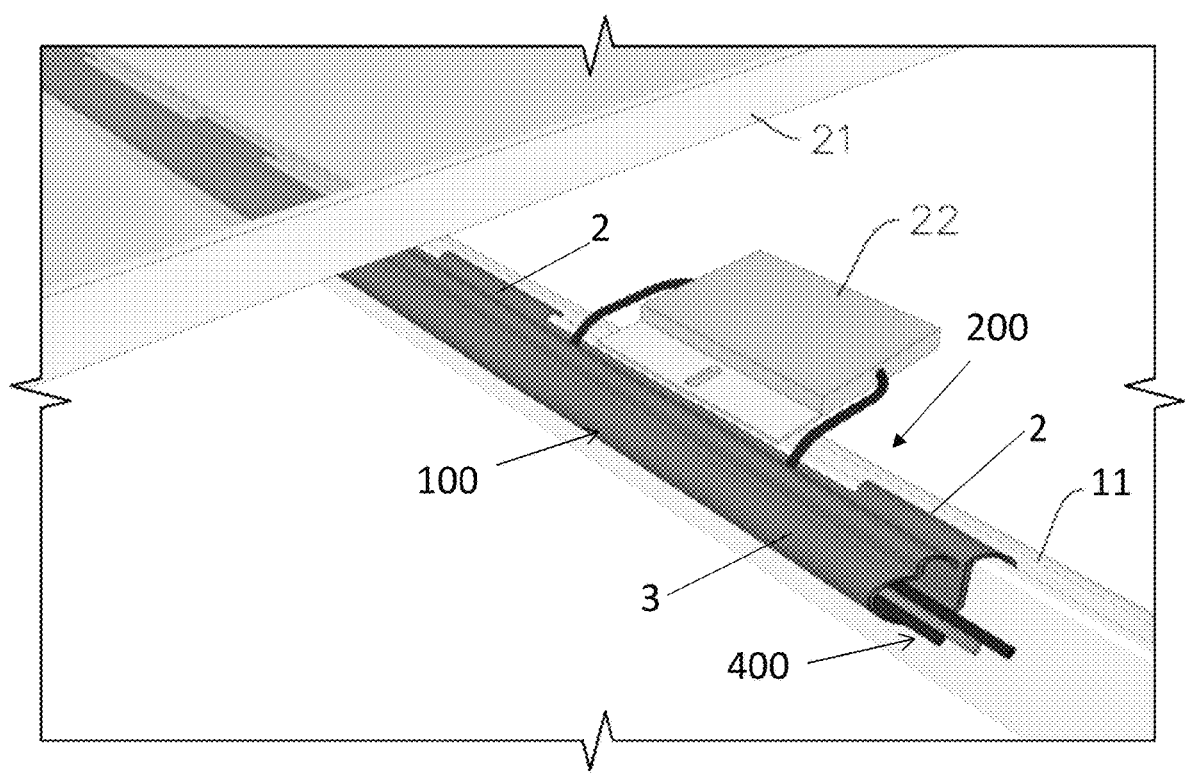
FIG. 8 is a perspective view of the photovoltaic wire management system in use, according to an embodiment of the present invention.

With reference to FIG. 8, an embodiment of the photovoltaic wire management system is shown in use. In the embodiment, a typical photovoltaic array is shown comprised of modules 21, Module Level Power Electronics 22, and mounting rails 200. A wire management duct 100 is mounted onto the mounting rail 200 via the mounting lip 2 engaging with a ledge of the rail slot 11. Wire channel 3 provides protection and support for one or more wires or cables 400. In the embodiment shown, the wire management duct 100 is provided with multiple mounting lips 2, such that a space provided between the mounting lips to accommodate MLPEs or other PV array components which also attach to the mounting rail 200.

Figure 9:
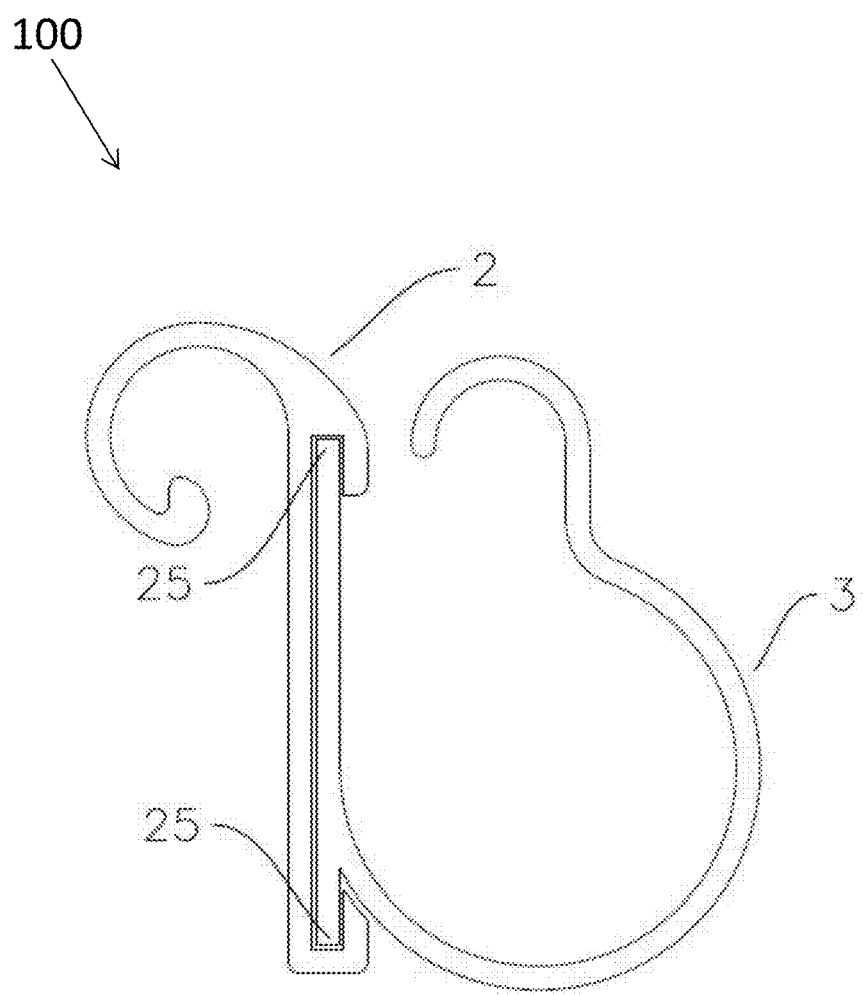
FIG. 9 is a side view of the photovoltaic wire management system, according to an embodiment of the present invention.
Figure 10:
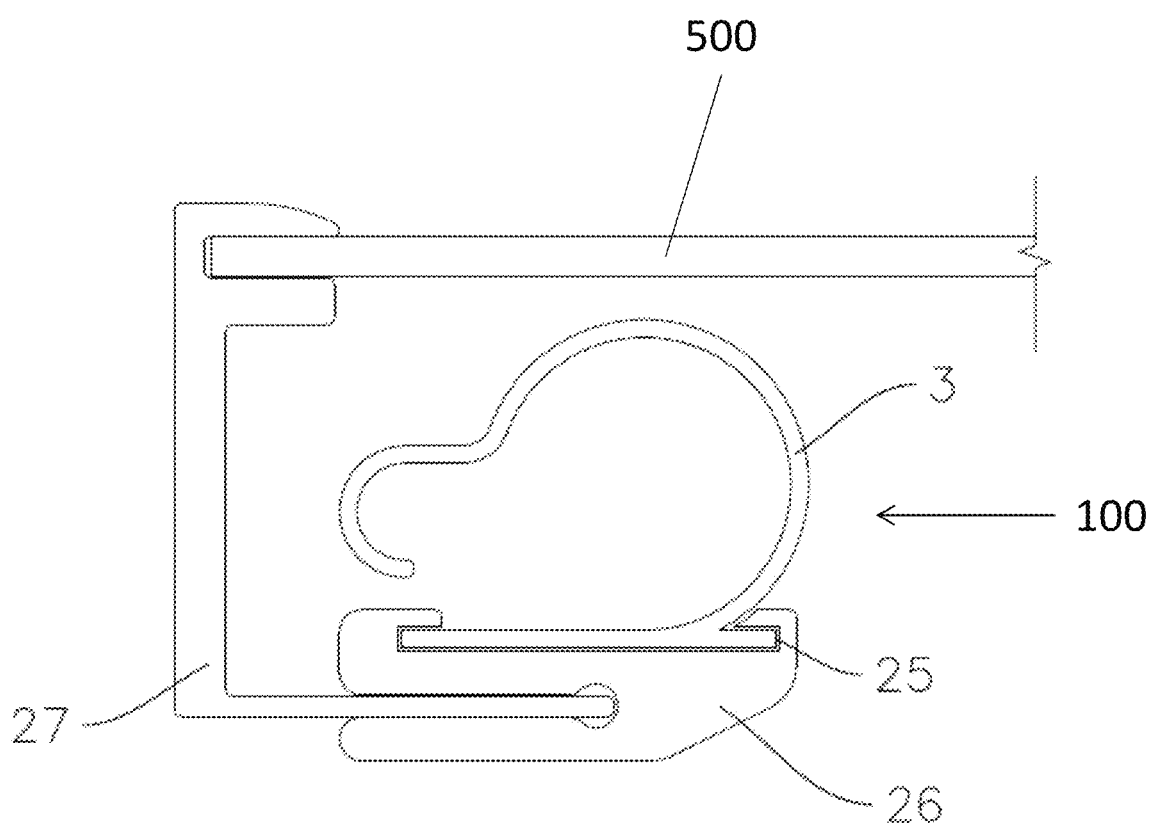
FIG. 10 is a side view of the photovoltaic wire management system, according to an embodiment of the present invention.

With reference to FIG. 9, an embodiment of the wire management duct 100 is shown wherein the mounting lip 2 and the wire channel 3 are provided as separate components. In the embodiment, the wire channel is provided with tabs 25 to be received by grooves provided by the mounting lip component 2. The embodiment allows the attachment to be moved to different points along the device to avoid interference with frame-attached With reference to FIGS. 10-11, an embodiment of the wire management duct 100 is shown. In the embodiment, the wire channel 3 is provided with tabs 25 to be received by grooves provided by a mounting clip 26. In an embodiment, the mounting clip attaches to the frame 27 of a photovoltaic array module 21. The mounting clip 26 may be constructed of metal or other material and fixed in place on the wire channel.

Figure 11:
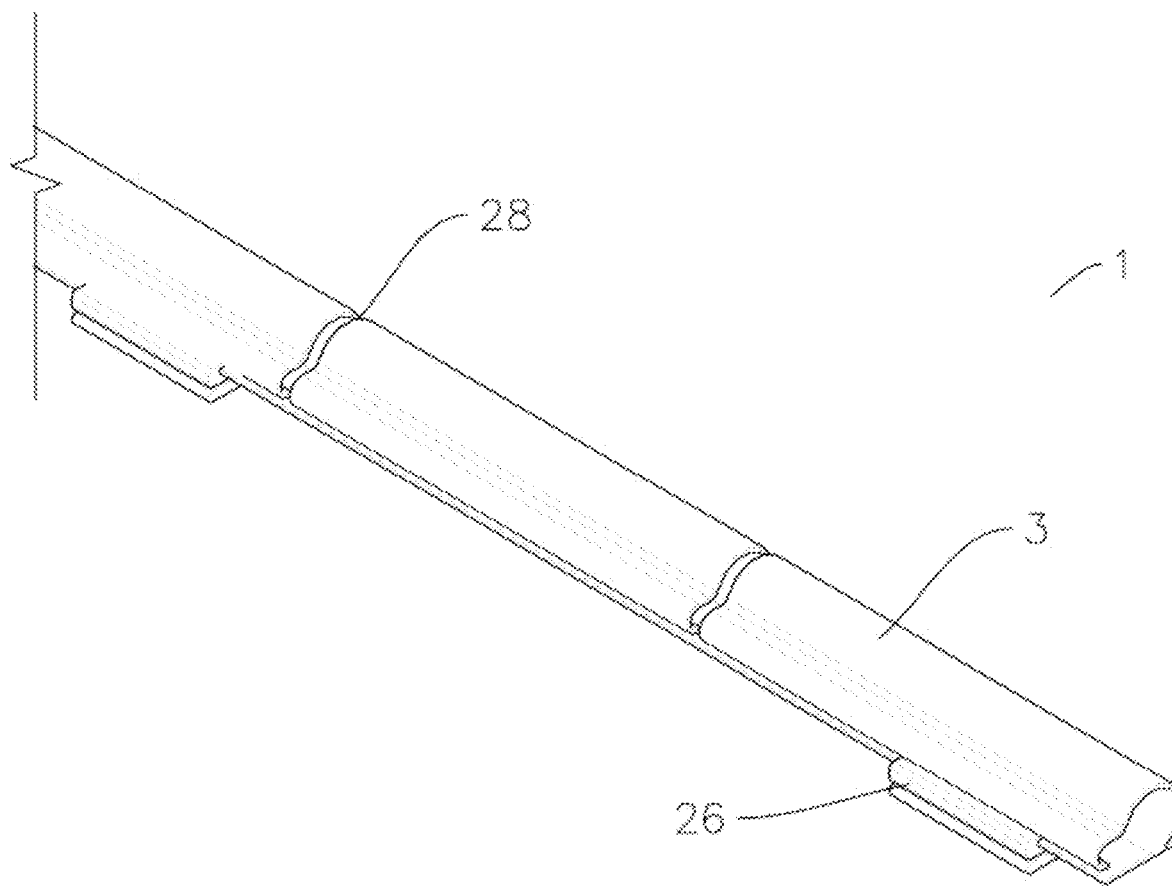
FIG. 11 is a perspective view of the photovoltaic wire management system according to an embodiment of the present invention.

In an embodiment, with reference to FIG. 11, the wire channel 3 is provided with one or more slots 28. The slots provide an alternative opening to allow wires and cables to enter and exit the channel in a direction more conducive with module attached wire management. In an embodiment, the wire duct is comprised of a flexible material and the slots 28 better allow the duct to be coiled, packed, and bent around corners.

Figure 12:
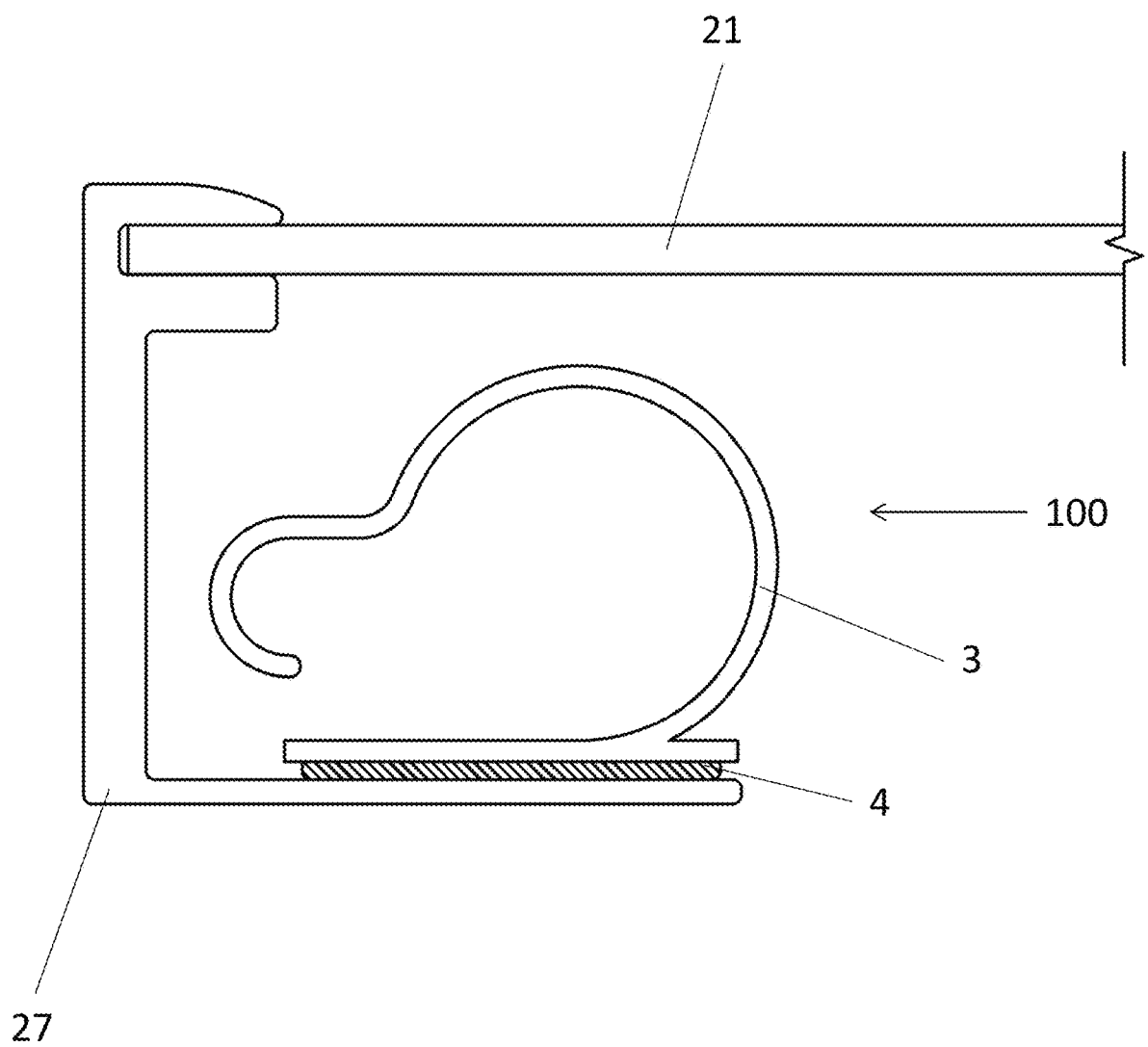
FIG. 12 is a side view of the photovoltaic wire management system, according to an embodiment of the present invention.

With reference to FIG. 12, in an embodiment, the wire duct 100 may be secured to the module frame 27 with an adhesive or adhesive backing 4. In an embodiment, integrated spacers are provided to elevate the channel above drain holes provided in the module frame 27.

Figure 13:
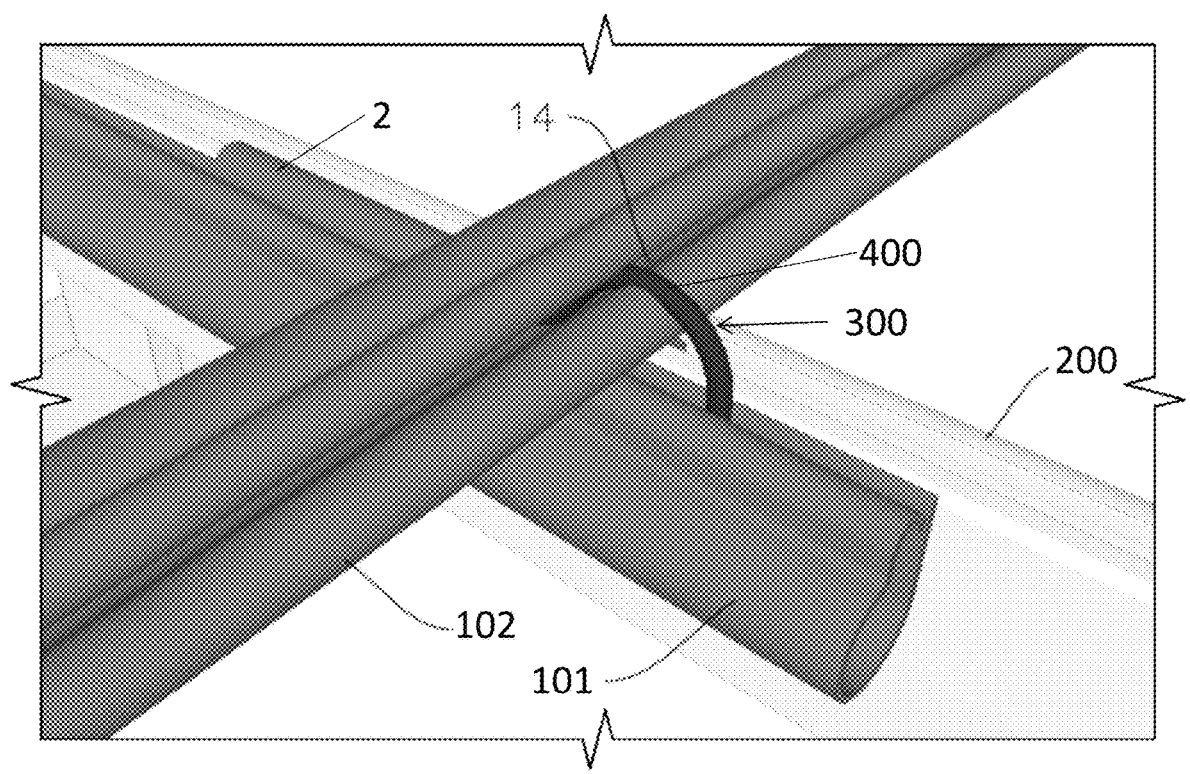
FIG. 13 is a perspective view of the photovoltaic wire management system in use, according to an embodiment of the present invention.

In reference to FIG. 13, an embodiment of the wire management system is shown in use. In the embodiment, a wire duct 101 is mounted parallel to a mounting rail 200 via a mounting lip 2 engaging with a ledge of the rail slot. A second wire duct 102 is mounted perpendicular to the mounting rail 200 by a perpendicular attachment clip 300. The clip 300 is received at one end by the rail slot, and at the other end by the mounting lip of duct 102. FIG. 12 further depicts a cable 400 which is provided in both wire channel of duct 101 and inserted into the opening 14 of the wire channel of duct 102.

The invention has been described herein using specific embodiments for the purposes of illustration only. It will be readily apparent to one of ordinary skill in the art, however, that the principles of the invention can be embodied in other ways. Therefore, the invention should not be regarded as being limited in scope to the specific embodiments disclosed herein, but instead as being fully commensurate in scope with the following claims.

The invention claimed is:

1. A wire management duct having:
   a length;
   a wire channel provided along the length and configured to hold a plurality of wires, the wire channel further having a channel wall, an opening catch, and an opening provided between the channel wall and the opening catch, wherein a portion of the wire channel is formed by a first arc having a first constant radius;
   one or more mounting lips provided along the length, extending from the wire channel, and formed by a curved section terminating at a hook, wherein the curved section of the one or more mounting lips is formed by a second arc having a second constant radius, and wherein the first constant radius of the arc of the wire channel is larger than the second constant radius of the one or more mounting lips; and
   wherein the one or more mounting lips configured to mount the wire management duct onto a mounting rail of a photovoltaic rail mounting system.

2. The wire management duct of claim 1, wherein the wire management duct is comprised of one continuous mounting lip provided along the length of the wire management duct.

3. The wire management duct of claim 1, wherein the wire channel is further provided with one or more slotted cutouts perpendicular to the length of the wire management duct.

4. The wire management duct of claim 1, wherein the channel wall is configured to rest against the mounting rail of the photovoltaic rail mounting system.

5. The wire management duct of claim 1, wherein the opening catch is formed by a third arc arc having a third constant radius.

6. The wire management duct of claim 1, wherein the second constant radius is approximately 4.5 millimeters, and wherein the first constant radius is approximately 10 millimeters.

7. The wire management duct of claim 4, wherein the channel wall further comprises an adhesive backing.

8. A wire management system comprising:
   one or more wire management ducts having:
      a length;
      a wire channel provided along the length and configured to hold a plurality of wires, the wire channel further having a channel wall, an opening catch, and an opening provided between the channel wall and the opening catch; and
      one or more mounting lips provided along the length, extending from the wire channel, and formed by a curved section terminating at a hook;
   one or more perpendicular attachment clips having:
      a first end configured to attach to one of the one or more mounting lips of the one or more wire management ducts; and
      a second end configured to be received by a photovoltaic mounting rail system,
   wherein the one or more mounting lips are configured to mount the one or more wire management ducts to the mounting rail system in parallel with a mounting rail to which it is mounted, and wherein the one or more perpendicular attachment clips are configured to mount the one or more wire management ducts to the photovoltaic mounting rail system perpendicular to the mounting rail to which it is mounted.

9. The wire management system of claim 8, wherein the wire management duct is comprised of one continuous mounting lip provided along the length of the wire management duct.

10. The wire management system of claim 8, wherein the wire channel is further provided with one or more slotted cutouts perpendicular to the length of the wire management duct.

11. The wire management system of claim 8, wherein the channel wall is configured to rest against the mounting rail of the photovoltaic rail mounting system.

12. The wire management system of claim 11, wherein the channel wall further comprises an adhesive backing.

13. A wire management system comprising:
   one or more wire management ducts, each duct having:
      a length; and
      a wire channel provided along the length and configured to hold a plurality of wires, the wire channel further having an opening catch and a channel wall, the channel wall having one or more grooves or tabs; and one or more frame mount clips having one or more grooves or tabs to engage with the one or more grooves or tabs of the wire channel, wherein the one or more frame mount clips are configured to mount the one or more wire management ducts to a frame of a photovoltaic module.

14. The wire management system of claim 13, further comprising an adhesive backing provided on the channel wall, wherein the adhesive backing is configured to mount the one or more wire ducts to a frame of a photovoltaic module.

15. The wire management system of claim 13, wherein the wire channel is further provided with one or more slotted cutouts perpendicular to the length of the wire management duct.

\* \* \* \* \*